(12) United States Patent
Makiyama

(10) Patent No.: US 11,562,897 B1
(45) Date of Patent: Jan. 24, 2023

(54) METHOD OF MANUFACTURING SEMICONDUCTOR DEVICE

(71) Applicant: RENESAS ELECTRONICS CORPORATION, Tokyo (JP)

(72) Inventor: Hideki Makiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/369,643

(22) Filed: Jul. 7, 2021

(51) Int. Cl.
*H01L 21/02* (2006.01)
*H01L 21/762* (2006.01)

(52) U.S. Cl.
CPC ...... *H01L 21/0201* (2013.01); *H01L 21/0203* (2013.01); *H01L 21/762* (2013.01)

(58) Field of Classification Search
CPC ............. H01L 21/0201; H01L 21/0203; H01L 21/762; H01L 21/312–3128; H01L 21/7681; H01L 21/76811; H01L 21/32; H01L 21/0273–0279; H01L 21/308–3083; H01L 21/0271–0279; H01L 21/027–0338
See application file for complete search history.

(56) References Cited

U.S. PATENT DOCUMENTS 8,871,596 B2 * 10/2014 Chen ................ H01L 29/66575
438/294

FOREIGN PATENT DOCUMENTS

JP 2019-186307 A 10/2019

* cited by examiner

*Primary Examiner* — Cuong B Nguyen
(74) *Attorney, Agent, or Firm* — McDermott Will & Emery LLP

(57) ABSTRACT

A wafer having a semiconductor substrate including a peripheral region and a central region, an insulating layer and a semiconductor layer is prepared first. Next, a plurality of trenches penetrating through the semiconductor layer and the insulating layer and reaching an inside of the semiconductor substrate are formed. Next, an inside of each of the plurality of trenches is filled with an insulating film, so that a plurality of element isolating portions is formed. Next, in the central region, the semiconductor layer exposed from a resist pattern is removed. The end portion closest to the outer edge of the semiconductor substrate among ends of the resist pattern used for removing the semiconductor layer in the central region is formed so as to be positioned closer to the outer edge of the semiconductor substrate than a position of the end portion closest to the outer edge of the semiconductor substrate among ends of the resist pattern used for forming the trenches.

7 Claims, 10 Drawing Sheets

METHOD OF MANUFACTURING SEMICONDUCTOR DEVICE

BACKGROUND

The present invention relates to a method of manufacturing a semiconductor device, and relates to a method of manufacturing a semiconductor device using, for example, an SOI substrate.

For semiconductor devices for lower power consumption, a technique of forming a MISFET (Metal Insulator Semiconductor Field Effect Transistor) on an SOI (Silicon On Insulator) substrate having a semiconductor substrate, an insulating layer formed on the semiconductor substrate and a silicon layer formed on the insulating layer is exemplified. In the MISFET formed on the SOI substrate, a parasitic capacitance resulted from a diffusion region formed in the silicon layer can be reduced. Therefore, the technique can improve an operation speed of the MISFET and achieve the low power consumption.

In a wafer having a substantially-circular planar shape and made of the SOI substrate, a specific process is performed to a peripheral region that is not used as a semiconductor chip as different from a central region that is used as the semiconductor chip.

There are disclosed techniques listed below.
[Patent Document 1] Japanese Unexamined Patent Application Publication No. 2019-186307

For example, the Japanese Unexamined Patent Application Publication No. 2019-186307 discloses a removal step of removing the silicon layer and the insulating layer in the peripheral region before formation of a trench for use in an element isolating portion in the wafer. Also, as a second study example, this Japanese Unexamined Patent Application Publication discloses an example of the formation of the trench for use in the element isolating portion in the wafer without the removal step.

In the Japanese Unexamined Patent Application Publication No. 2019-186307, after the foregoing steps, a step of dividing the central region into an SOI region where the silicon layer and the insulating layer remain and a bulk region where the silicon layer and the insulating layer are removed by removing the silicon layer and the insulating layer in a part of the central region is performed.

SUMMARY

According to the study of the inventors of the present application, it has been found that, when a side surface of the silicon layer is exposed in the step of manufacturing the wafer, the insulating layer in a base is scraped off by various steps such as a wet etching process step, a rinsing (washing) step or others, which results in failure that is peeling off of the silicon layer. Also, it has been found that there is a failure that is generation of undesirable foreign substances on a boundary between the silicon layer and the insulating layer. In the Patent Document 1, special countermeasures against the exposure of the side surface of the silicon layer have not been made.

A main purpose of the present application is to provide a manufacturing method capable of solving these failures, and is to improve reliability of a manufactured semiconductor device (semiconductor chip) because of this method. Other objects and novel characteristics will be apparent from the description of the present specification and the accompanying drawings.

The summary of the typical aspects of the embodiments disclosed in the present application will be briefly described as follows.

A method of manufacturing a semiconductor device according to an embodiment includes: (a) a step of preparing a wafer having: a semiconductor substrate including: a peripheral region with a first width from its outer edge toward its center, and a central region surrounded by the peripheral region in a plan view; an insulating layer formed on the semiconductor substrate in each of the peripheral region and the central region; and a semiconductor layer formed on the insulating layer in each of the peripheral region and the central region; (b) a step of, after the step (a), forming a first insulating film on the semiconductor layer in each of the peripheral region and the central region; (c) a step of, after the step (b), forming a first resist pattern selectively each of covering a part of the first insulating film in the peripheral region and a part of the central region; (d) a step of, after the step (c), forming a plurality of trenches penetrating through the first insulating film, the semiconductor layer and the insulating layer and reaching an inside of the semiconductor substrate by performing a first etching process with the first resist pattern as a mask, the first resist pattern having a first end portion that is the closest to the outer edge of the semiconductor substrate; (e) a step of, after the step (d), removing the first resist pattern; (f) a step of, after the step (e), forming a plurality of element isolating portions by filling an inside of each of the plurality of trenches, in each of the peripheral region and the central region, with a second insulating film made of a different material from a material of the first insulating film; (g) a step of, after the step (f), removing the first insulating film in each of the peripheral region and the central region; (h) a step of, after the step (g), forming a second resist pattern selectively covering the semiconductor layer in the peripheral region and the semiconductor layer in a part of the central region, the second resist pattern having a second end portion that is the closest to the outer edge of the semiconductor substrate; and (i) a step of, after the step (h), removing the semiconductor layer exposed from the second resist pattern in the central region by performing a second etching process with the second resist pattern as a mask. In the step (h), the second resist pattern is formed such that the second end portion of the second resist pattern is positioned to be closer to the outer edge of the semiconductor substrate than a position of the first end portion of the first resist pattern in the step (c).

BRIEF DESCRIPTIONS OF THE DRAWINGS

DETAILED DESCRIPTION

Figure 1:
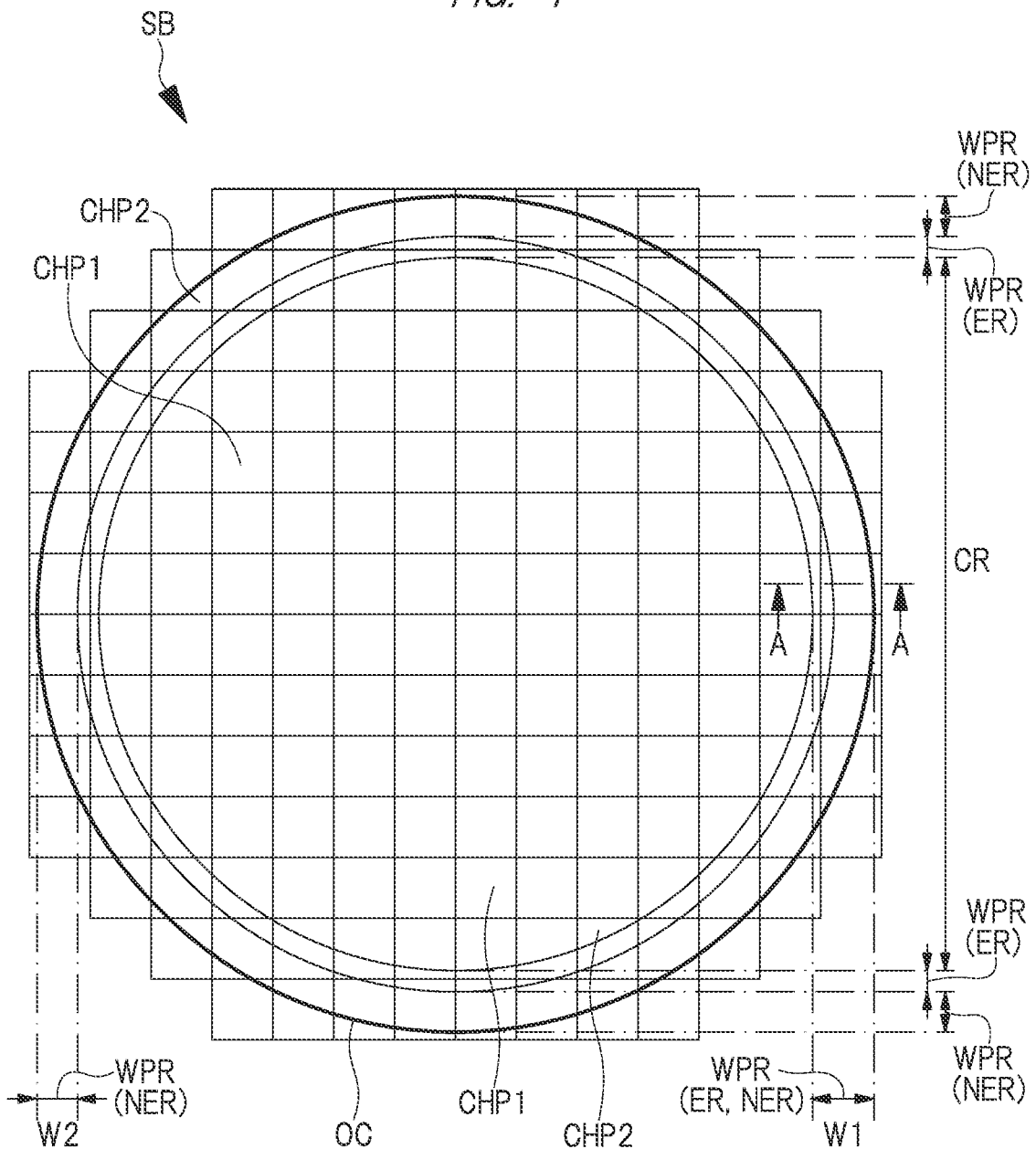
FIG. 1 is a plan view of a semiconductor substrate according to a first embodiment.

Embodiments will be described in detail below on the basis of the accompanying drawings. In all the drawing for use in describing the embodiments, the same reference symbols are attached to the same elements having the same function, and the repetitive description thereof will be omitted. In addition, the description of the same or similar portions is not repeated in principle unless otherwise particularly required in the following embodiments. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments, a term "p type" means a conductive type described in a semiconductor to which impurities such as boron (B), boron difluoride ($BF_2$) or others is introduced, and a term "n type" means a conductive type described in a semiconductor to which impurities such as arsenic (As), phosphorous (P) or others is introduced.

First Embodiment

FIG. 1 is a plan view of a semiconductor substrate SB according to a first embodiment. As shown in FIG. 1, a planar shape of the semiconductor substrate SB is circular. The semiconductor substrate SB has a central region CR where a semiconductor element contributing to an integrated circuit of a semiconductor device is formed and a peripheral region WPR surrounding the central region CR. The peripheral region WPR has an element formation region ER and a non-element formation region NER.

A plurality of semiconductor chips that are the semiconductor devices of the first embodiment can be obtained by individualization of the semiconductor substrate SB through a dicing step or others. In FIG. 1, a region to be the plurality of semiconductor chips is illustrated as a grid-form region. A semiconductor chip CHP1 of the plurality of semiconductor chips is a semiconductor chip having only the semiconductor substrate SB in the central region CR, and is a semiconductor chip to be selected as a product shipment chip. A semiconductor chip CHP2 of the plurality of semiconductor chips is a semiconductor chip having the semiconductor substrate SB except in the central region CR, that is a semiconductor chip having the semiconductor substrate SB in the peripheral region WPR, and is a semiconductor chip not to be selected as the product shipment chip.

The peripheral region WPR is a region having a width W1 extending from the outer edge OC of the semiconductor substrate SB toward the center of the semiconductor substrate SB. The non-element formation region NER of the peripheral region WPR has a width W2 extending from the outer edge OC toward the center of the semiconductor substrate SB. In this case, the width W1 is larger than the width W2.

A region between the central region CR and the non-element formation region NER becomes the element formation region ER. In other words, the element formation region ER is a region surrounded by the non-element formation region NER in a plan view. The central region CR is a region surrounded by the peripheral region WPR (the non-element formation region NER and the element formation region ER) in a plan view. In the first embodiment, the width W1 is, for example, 2.5 mm to 3.5 mm, and the width W2 is, for example, 1.5 mm to 2.2 mm.

Although described in detail later, the plurality of semiconductor elements may be formed in the element formation region ER. In the first embodiment, for example, a MISFET 3Q is exemplified as such a semiconductor element. The MISFET 3Q is a dummy MISFET that is not used as the integrated circuit of the semiconductor chip CHP1. In the entire non-element formation region NER, not the MISFETs 1Q to 3Q as described above but the element isolating portion STI is formed.

<Method of Manufacturing Semiconductor Device>

With reference to FIGS. 2 to 15, the method of manufacturing the semiconductor device according to the first embodiment and features of the method will be explained below.

Figure 2:
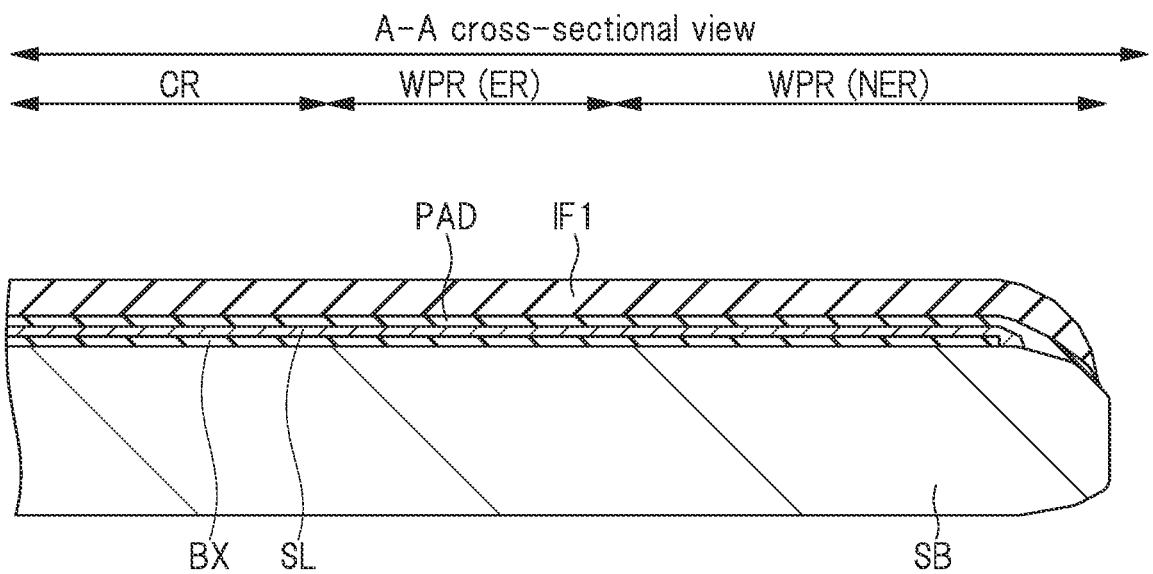
FIG. 2 is a cross-sectional view showing a step of manufacturing a semiconductor device according to the first embodiment.

FIG. 2 is a cross-sectional view taken along a line A-A of FIG. 1, and shows a vicinity of a boundary between the central region CR and the peripheral region WPR. FIGS. 3 to 15 show the manufacturing steps continued after FIG. 2.

First, as shown in FIG. 2, a wafer (SOI substrate) is prepared, the wafer having a semiconductor substrate SB that is a supporting substrate, having an insulating layer BX formed on the semiconductor substrate SB, and having a semiconductor layer SL formed on the insulating layer BX.

The semiconductor substrate SB is preferably made of a single crystal silicon having a specific resistance of about 1 Ωcm to 10 Ωcm, such as a p-type single crystal silicon. The insulating layer BX is made of, for example, silicon oxide. A thickness of the insulating layer BX is, for example, 10 nm to 20 nm. The semiconductor layer SL is preferably made of a single crystal silicon having a specific resistance of about 1 Ωcm to 10 Ωcm. A thickness of the semiconductor layer SL is, for example, 10 nm to 20 nm. Note that the semiconductor layer SL is an intrinsic semiconductor layer doped with neither the n-type nor p-type impurities by ion implantation or others. Alternatively, even if the p-type impurities are doped into the semiconductor layer SL, its impurity concentration is equal to or lower than $1 \times 10^{13}/cm^3$.

An example of a step of preparing such an SOI substrate will be explained below. The SOI substrate can be manufactured by, for example, a bonding method. In the bonding method, for example, after the insulating layer BX is formed by oxidation of a surface of a first semiconductor substrate made of silicon (Si), a second semiconductor substrate made of silicon is bonded to the first semiconductor substrate under a high temperature by compression bonding, and then, the second semiconductor substrate is thinned. In this case, the thin film of the second semiconductor substrate remaining above the insulating layer BX becomes the semiconductor layer SL, and the first semiconductor substrate below the insulating layer BX becomes the semiconductor substrate SB. There is no insulating layer BX near the outer edge OC of the semiconductor substrate SB, and the second semiconductor substrate is directly compressed and bonded to the first semiconductor substrate. Therefore, FIG. 2 shows an example of unification of the semiconductor substrate SB and the semiconductor layer SL near the outer edge OC.

Next, on the semiconductor layer SL in the central region CR and the peripheral region WPR, an insulating film PAD made of, for example, silicon oxide is formed by, for example, a CVD (Chemical Vapor Deposition) method. A thickness of the insulating film PAD is, for example, 10 nm to 20 nm. Next, on the insulating film PAD in the central region CR and the peripheral region WPR, an insulating film IF1 made of, for example, silicon nitride is formed by, for example, a CVD method. A thickness of the insulating film IF1 is, for example, 80 nm to 120 nm.

Figure 3:
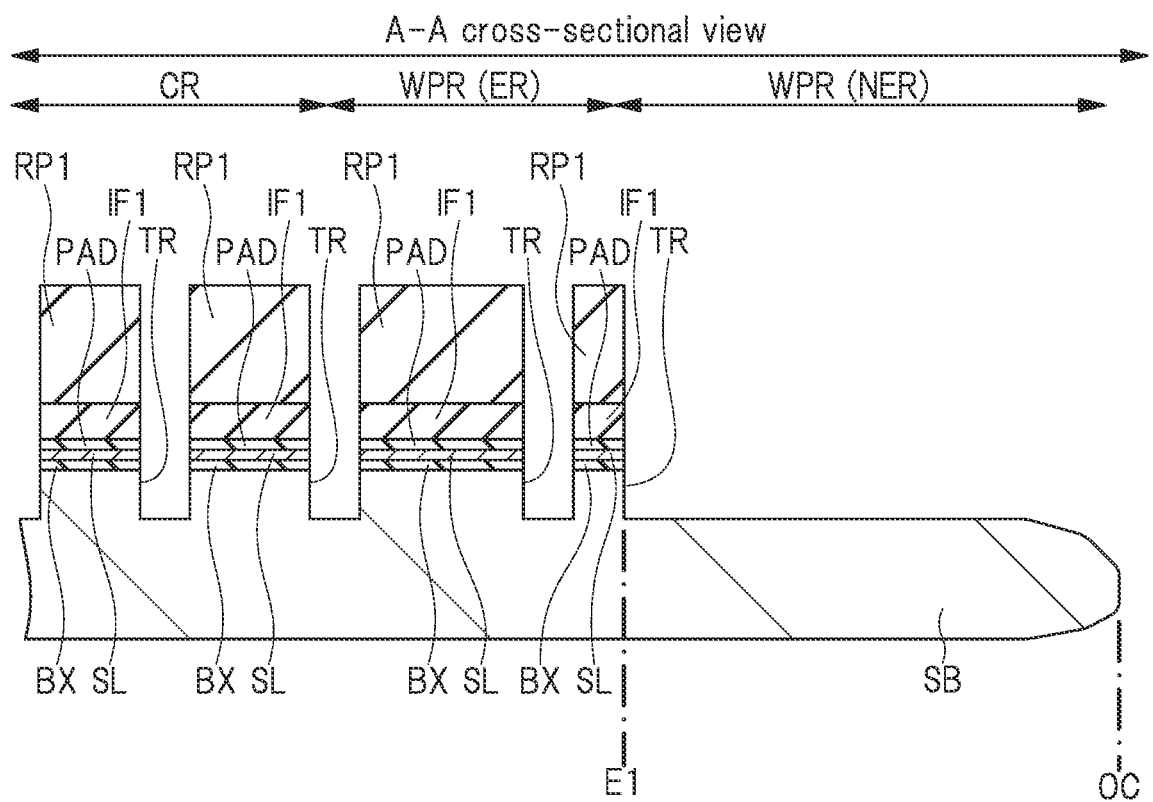
FIG. 3 is a cross-sectional view showing a manufacturing step continued from FIG. 2.

FIG. 3 shows a step of forming a resist pattern RP1 and a trench (groove) TR.

First, the resist pattern RP1 selectively covering a part of the insulating film IF1 in the peripheral region WPR and the insulating film IF1 in a part of the central region CR is formed.

Next, a plurality of trenches TR penetrating through the insulating film IF1, the insulating film PAD, the semiconductor layer SL and the insulating layer BX and reaching an inside of the semiconductor substrate SB are formed by an anisotropic etching process (dry etching process) making use of the resist pattern RP1 as a mask. Each depth of the plurality of trenches TR is, for example, 250 nm to 300 nm. Then, the resist pattern RP1 is removed by, for example, an ashing process.

In this case, the end portion E1 of the resist pattern RP1 closest to the outer edge OC of the semiconductor substrate SB is positioned near the boundary between the non-element formation region NER and the element formation region ER. Therefore, the trench TR is formed so as to extend from the end portion E1 to the outer edge OC, and the trench TR is formed in almost the entire non-element formation region NER.

Figure 4:
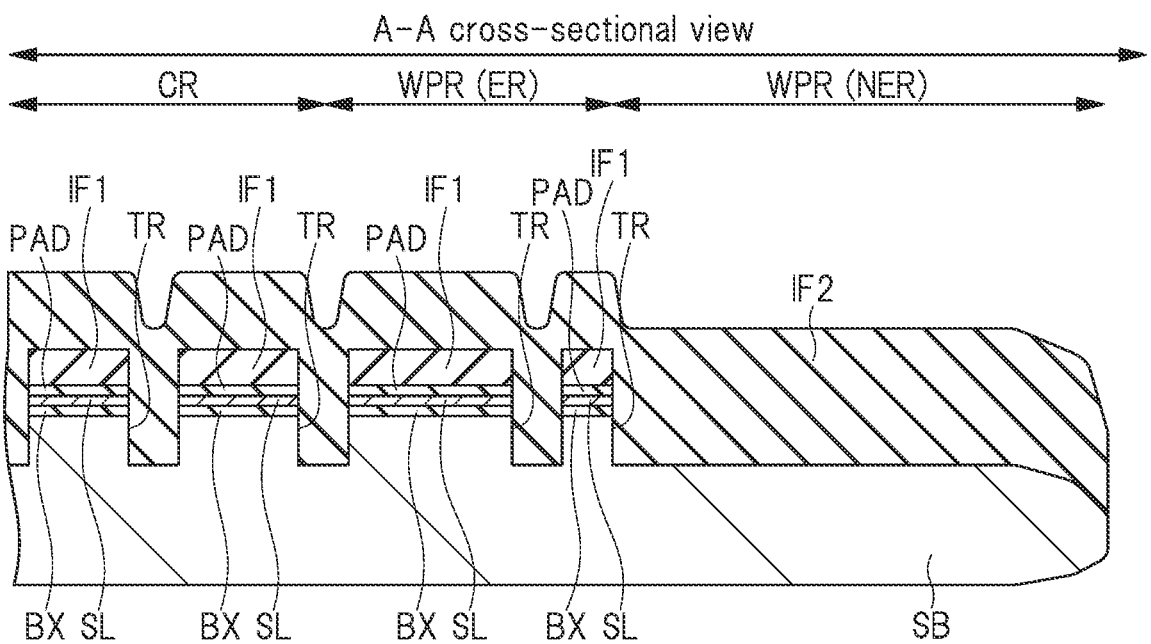
FIG. 4 is a cross-sectional view showing a manufacturing step continued from FIG. 3.

FIG. 4 shows a step of forming the insulating film IF2.

The insulating film IF2 is formed at an inside of each of the plurality of trenches TR and also formed on the insulating film IF1, in the central region CR and the peripheral region WPR, that is outside the plurality of trenches TR by using, for example, a CVD method. The insulating film IF2 is made of a material that is different from that of the insulating film IF1, and is made of, for example, silicon oxide.

Figure 5:
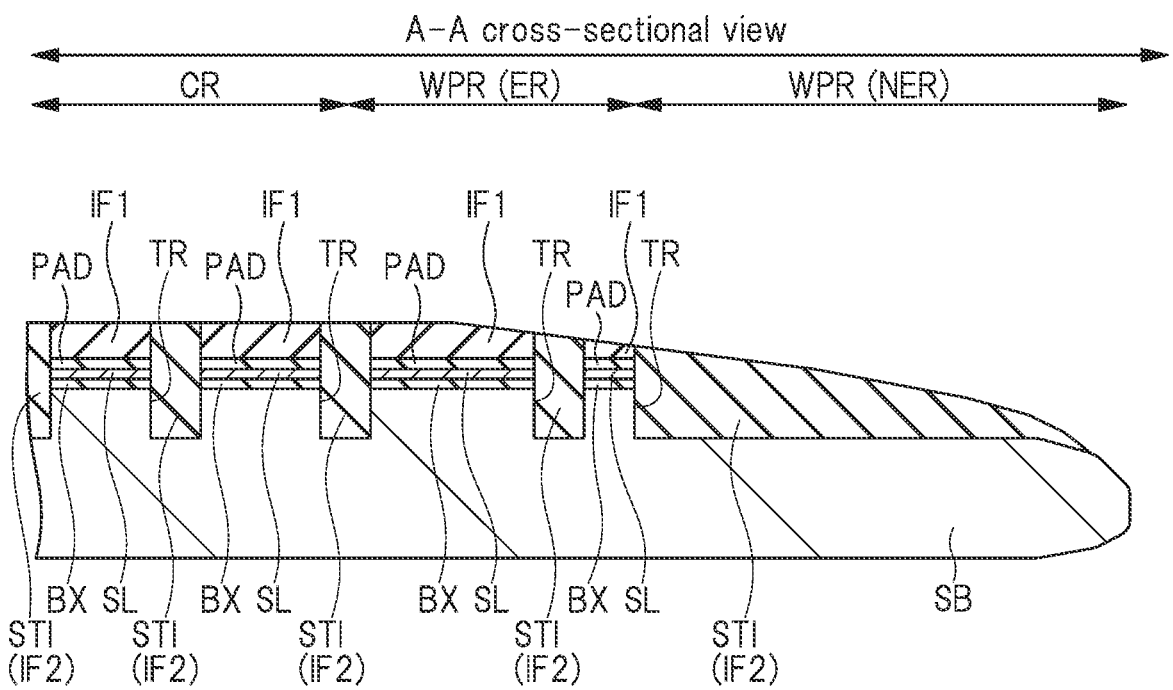
FIG. 5 is a cross-sectional view showing a manufacturing step continued from FIG. 4.

FIG. 5 shows a step of forming the element isolating portion STI.

By, for example, a polishing process using a CMP (Chemical Mechanical Polishing) method, the insulating film IF2 formed on the insulating film IF1 is removed such that the insulating film IF2 inside the plurality of trenches TR remains. In this manner, a plurality of element isolating portions STI is formed by filling an inside of each of the plurality of trenches TR, in the central region CR and the peripheral region WPR, with the insulating film IF2.

In the CMP method, a polished amount in the peripheral region WPR tends to be larger than that in the central region CR. Therefore, as shown in FIG. 5, the closer a polished portion of the insulating film IF2 in the peripheral region WPR gets to the outer edge OC, the thicker the portion is. When an upper surface of the semiconductor substrate SB is exposed because the amount of the polished insulating film IF3 in the peripheral region WPR is too large, failure is possibly caused in subsequent manufacturing steps. However, there is no particular problem if the upper surface of the semiconductor substrate SB is not exposed by the amount.

In this polishing process, the insulating film IF1 functions as an etching stopper film. As described above, in the peripheral region WPR, the amount of the polished insulating film IF2 is large. Therefore, the insulating film IF2 in the peripheral region WPR is subjected to the polishing process at an early stage. Thus, the insulating film IF2 is preferably a film that is more difficult to be polished than the insulating film IF1. However, the peripheral region WPR is a region not to be used as the final product shipment chip. Therefore, even if the insulating film IF2 in the peripheral region WPR is completely scraped off, there is no particular large problem.

<Regarding First Study Example and its Problem>

In this chapter, a method of manufacturing a semiconductor device according to a first study example and its problem will be explained with reference to FIGS. 16 and 17. The manufacturing method of the first study example is based on the manufacturing method of the Patent Document 1.

Figure 16:
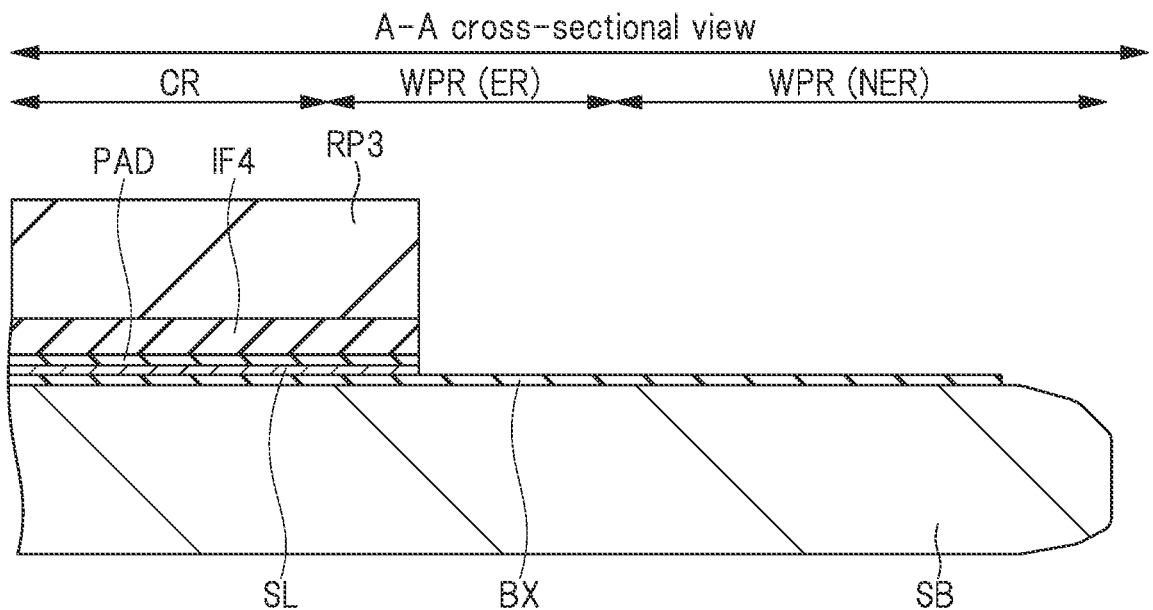
FIG. 16 is a cross-sectional view showing a step of manufacturing a semiconductor device according to a first study example.

First, as shown in FIG. 16, after the formation of the insulating film PAD, an insulating film IF4 made of, for example, silicon nitride is formed on the insulating film PAD in the central region CR and the peripheral region WPR by, for example, a CVD method. Next, a resist pattern RP3 covering the central region CR and a part of the peripheral region WPR is formed. Next, when a wet etching process and a dry etching process making use of the resist pattern RP3 as a mask is performed, the insulating film IF4, the insulating film PAD and the semiconductor layer SL exposed from the resist pattern RP3 are removed. Then, the resist pattern RP3 is removed by an ashing process, and the insulating film IF4 is removed by a wet etching process.

Figure 17:
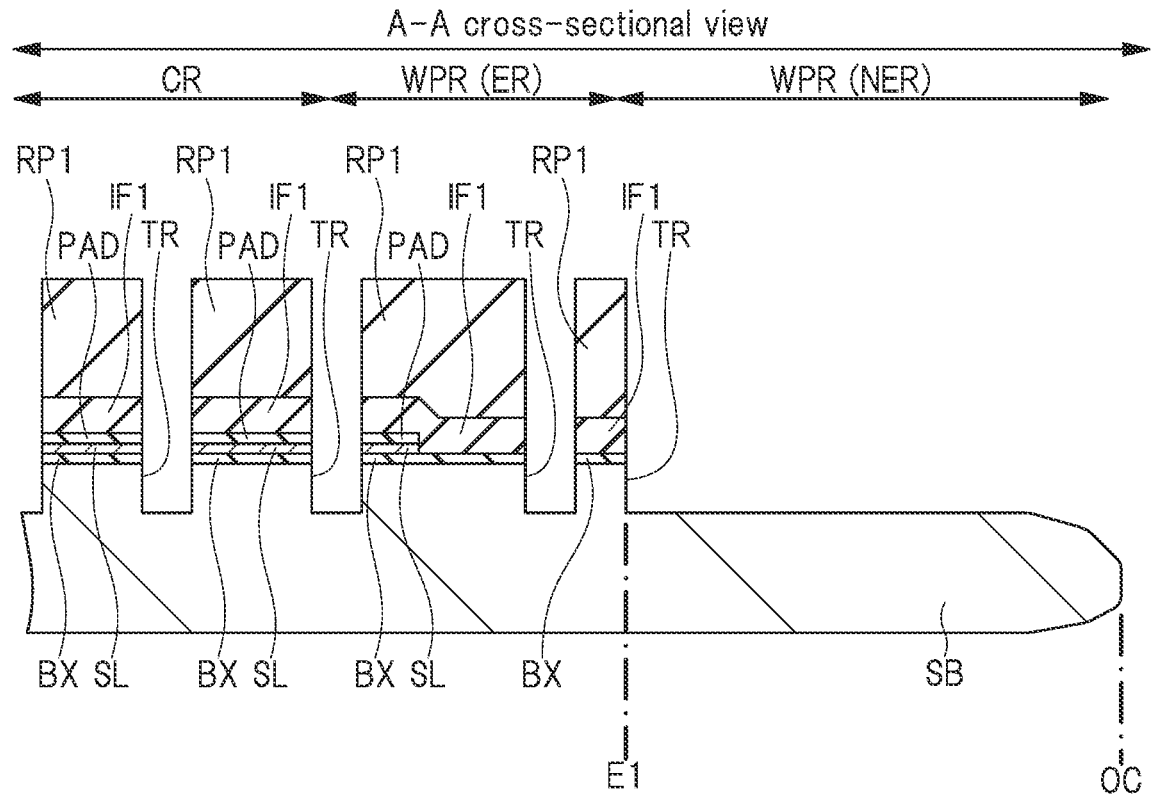
FIG. 17 is a cross-sectional view showing a manufacturing step continued from FIG. 16.

In FIG. 17, first, the insulating film IF1 explained in FIG. 2 is formed. Then, the similar manufacturing steps to FIG. 3 are performed. In other words, the plurality of trenches TR are formed by the formation of the resist pattern RP1 and an anisotropic etching process making use of the resist pattern RP1 as the mask. Then, the inside of each of the plurality of trenches TR is filled with the insulating film IF2, so that the plurality of element isolating portions STI is formed.

As described above, in the first study example, the peripheral region WPR is processed before the formation of the plurality of trenches TR. However, by this process for the peripheral region WPR, a side surface of the semiconductor layer SL is exposed in a course from FIG. 16 to FIG. 17. In this state, the step of removing the resist pattern RP3 and the insulating film IF4 and various washing steps before and after the removal step are performed. Therefore, the insulating layer BX below the semiconductor layer SL may be scraped off by these steps, and the semiconductor layer SL may be peeled off. And, the undesirable foreign substances may be generated on the boundary between the semiconductor layer SL and the insulating layer BX.

If the peeled semiconductor layer SL and the undesirable foreign substances exist on the wafer, the peeled semiconductor layer SL and the foreign substances become the etching mask in, for example, the subsequent etching process, and a failure disabling the process to form the normal shape is caused. By such a failure, an undesirable leakage path may be formed, and the reliability of the semiconductor device is reduced.

On the other hand, in the first embodiment, the process for the peripheral region WPR as described in the first study example is not performed. Therefore, the side surface of the semiconductor layer SL is not exposed in the state in which the trench TR and the element isolating portion STI are formed as shown in FIG. 5. In other words, the boundary between the semiconductor layer SL and the insulating layer BX is covered with the element isolating portion STI, and the side surface of the semiconductor layer SL is also covered with the element isolating portion STI. Therefore, the first embodiment can suppress the failure that is the concern of the first study example, and can improve the reliability of the semiconductor device.

Figure 6:
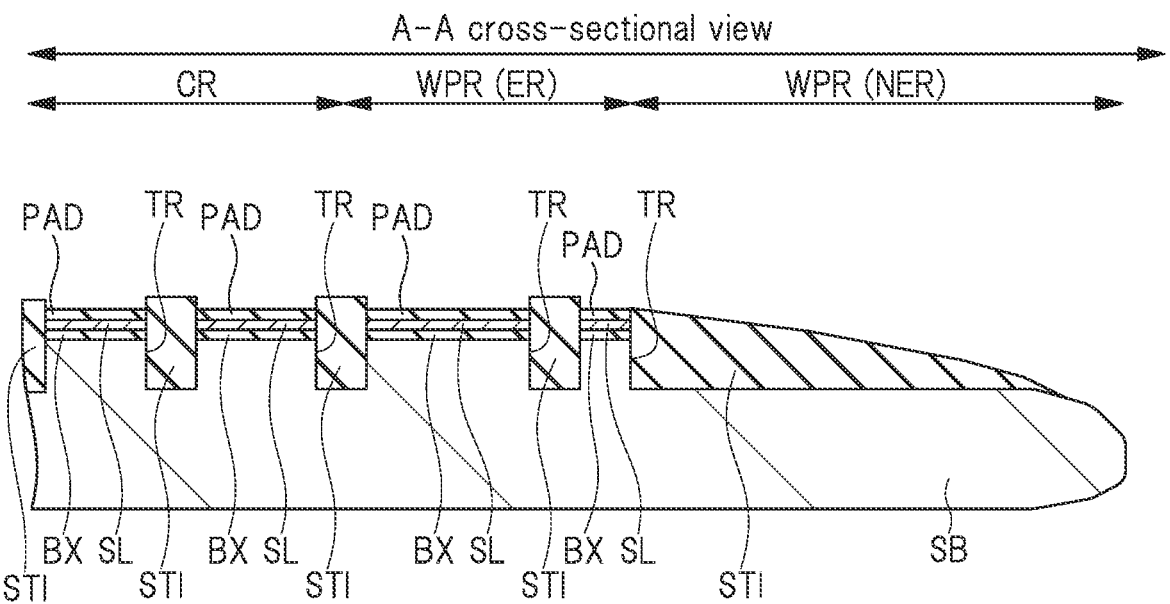
FIG. 6 is a cross-sectional view showing a manufacturing step continued from FIG. 5.

FIG. 6 shows a step of manufacturing the semiconductor device continued from FIG. 5, that is a step of removing the insulating film IF1.

First, in the central region CR and the peripheral region WPR, a surface of the element isolating portion STI is recessed by, for example, a wet etching process. An amount of the recession is about 30 nm to 50 nm. A main purpose of this wet etching process is to adjust a height of the element isolating portion STI. Next, in the central region CR and the peripheral region WPR, the insulating film IF1 is removed by, for example, a wet etching process.

Figure 7:
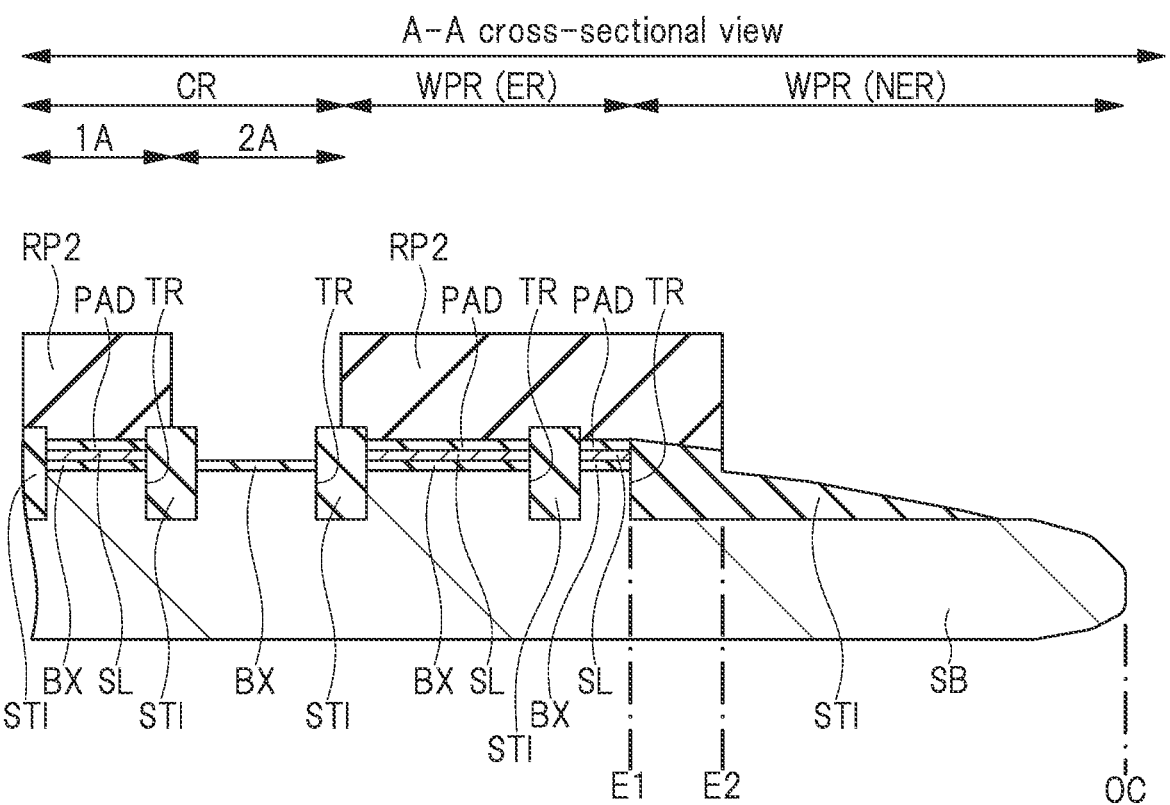
FIG. 7 is a cross-sectional view showing a manufacturing step continued from FIG. 6.

FIG. 7 shows a step of dividing the central region CR into an SOI region 1A and a bulk region 2A. Although not illustrated in the drawing, ion implantation is performed first in order to form each well region and others in the semiconductor substrate SB. Next, a resist pattern RP2 selectively covering the semiconductor layer SL in the peripheral region WPR and the semiconductor layer SL in a part of the central region CR is formed. Next, by a wet etching process making use of the resist pattern RP2 as a mask, the insulating film PAD exposed from the resist pattern RP2 is removed in the central region CR.

Next, by a dry etching process making use of the resist pattern RP2 as a mask, the semiconductor layer SL exposed from the resist pattern RP2 is removed in the central region CR. In this manner, the central region CR is divided into the SOI region 1A where the semiconductor layer SL remains and the bulk region 2A where the semiconductor layer SL is removed.

In the present step, the resist pattern RP2 is formed (arranged) such that the end portion E2 of the resist pattern RP2 closest to the outer edge OC of the semiconductor substrate SB is positioned to be closer to the outer edge OC of the semiconductor substrate SB than the position of the end portion E1 of the resist pattern RP1 closest to the outer edge OC of the semiconductor substrate SB in the step of FIG. 3. In other words, the end portion E2 is positioned on the element isolating portion STI in the non-element formation region NER. A reason why the position of the end portion E2 is set as described above will be explained below with reference to the second study example of FIG. 18.

<Regarding Second Study Example and its Problem>

Figure 18:
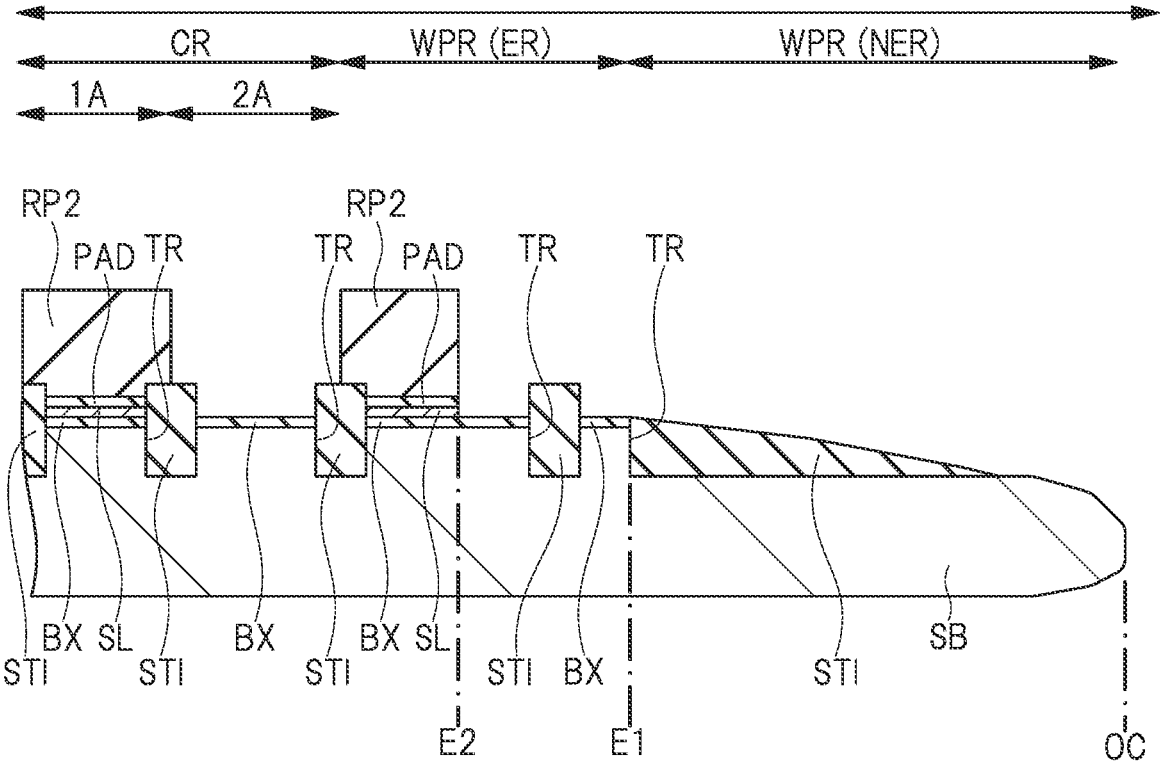
FIG. 18 is a cross-sectional view showing a step of manufacturing a semiconductor device according to a second study example.

FIG. 18 shows a step of manufacturing a semiconductor device according to the second study example, that is a manufacturing step continued from FIG. 6. In the second study example, the position of the end portion E2 of the resist pattern RP2 is different from that of FIG. 7 of the first embodiment.

As shown in FIG. 18, in the second study example, the end portion E2 is farther than the end portion E1 from the outer edge OC. Therefore, the part of the semiconductor layer SL remaining in the peripheral region WPR is not covered with the resist pattern RP2, and the part of the semiconductor layer SL is patterned. Then, the subsequent manufacturing steps are performed in the exposure state of the side surface of the semiconductor layer SL. This case causes the failure that is the peeling of the semiconductor layer SL or the generation of the undesirable foreign substances on the boundary between the semiconductor layer SL and the insulating layer BX as similar to the case explained in the first study example.

In the first embodiment, the process for the peripheral region WPR as described in the first study example is not performed, and besides, the end portion E2 is closer than the end portion E1 to the outer edge OC as shown in FIG. 7. Therefore, the side surface of the semiconductor layer SL in each of the central region CR and the peripheral region WPR is not exposed.

Figure 8:
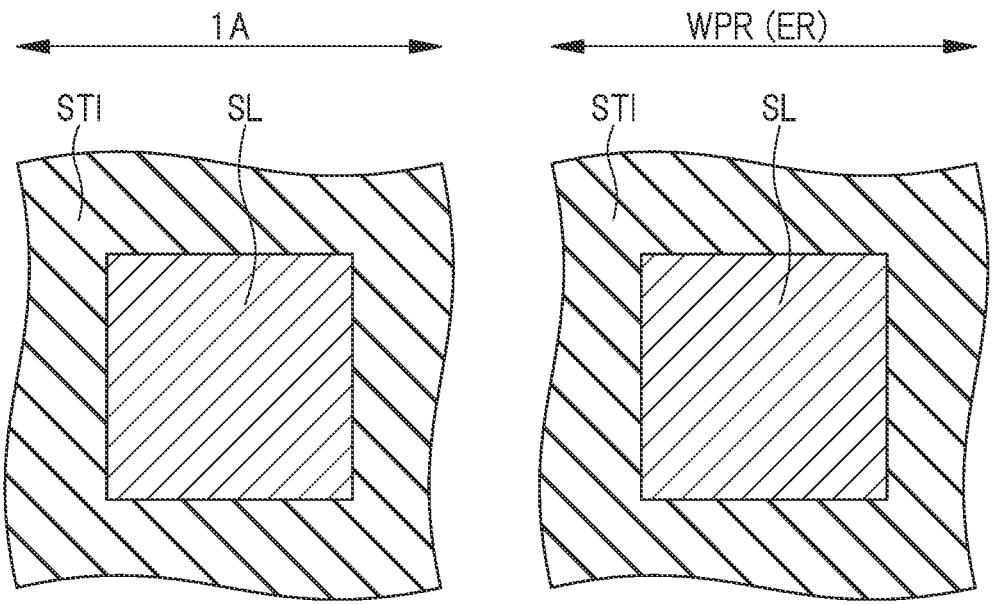
FIG. 8 is a plan view showing a periphery of a semiconductor layer according to the first embodiment.

FIG. 8 is a plan view showing a periphery of the semiconductor layer SL obtained after the manufacturing step of FIG. 7.

As shown in FIG. 8, the semiconductor layer SL remaining in the peripheral region WPR and the semiconductor layer SL remaining in the central region CR are surrounded by the element isolating portion STI in a plan view. In the peripheral region WPR and central region CR, note that the boundary between the semiconductor layer SL and the insulating layer BX is also surrounded by the element isolating portion STI in a plan view. In other words, in the peripheral region WPR and central region CR, the side surface of the semiconductor layer SL and the boundary between the semiconductor layer SL and the insulating layer BX are covered by the element isolating portion STI. Therefore, the first embodiment can suppress the failures caused in the first and second study examples, and thus, the reliability of the semiconductor device can be further improved.

Figure 9:
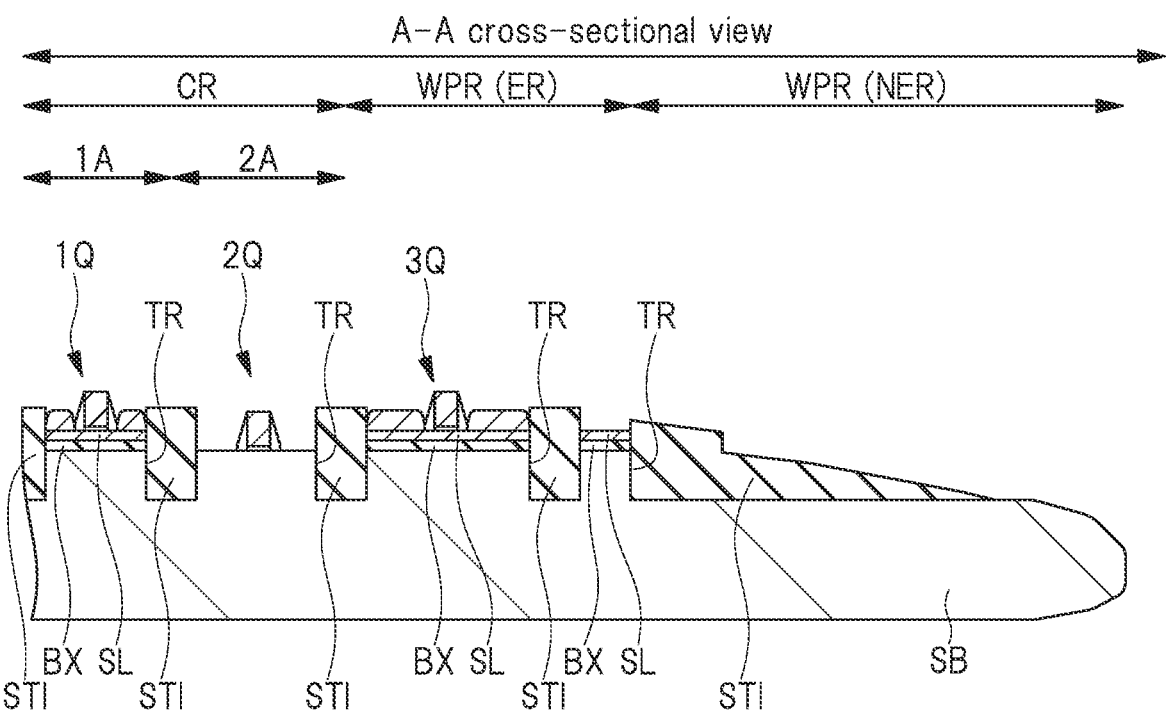
FIG. 9 is a cross-sectional view showing a manufacturing step after FIG. 7.

FIG. 9 is a cross-sectional view showing an outline of a semiconductor device that has been subjected to various manufacturing steps after the state of FIG. 7.

A MISFET 1Q is formed in the SOI region 1A, a MISFET 2Q is formed in the bulk region 2A, and a MISFET 3Q is formed in the element formation region ER. The MISFET 1Q and the MISFET 2Q configure a part of the integrated circuit of the semiconductor device (semiconductor chip CH1). The MISFET 1Q is a transistor that can operate faster than the MISFET 2Q, and is used for, for example, a logic circuit or a SRAM (Static Random Access Memory) circuit. The MISFET 2Q is a transistor having a higher withstanding voltage than that of the MISFET 1Q, and is used for, for example, an input/output protection circuit.

The MISFET 3Q is a dummy MISFET not configuring the integrated circuit of the semiconductor device (semiconductor chip CH1). The MISFET 3Q is a dummy element mainly intended to improve the yield or others, and is formed in order to, for example, equalize the process environment for the light exposure, the etching and others between the MISFET 1Q or the MISFET 2Q in the central region CR. Therefore, the MISFET 3Q has almost the same structure as that of the MISFET 1Q, but is not electrically connected to the MISFET 1Q or the MISFET 2Q.

<Step of Manufacturing MISFETs 1Q and 2Q>

A step of manufacturing the MISFETs 1Q and 2Q that are semiconductor elements in the central region CR will be explained below. FIGS. 10 to 15 are cross-sectional diagrams each showing a step of manufacturing the central region CR, that is a middle manufacturing step in the course from those of FIGS. 6 to 9. The explanation in FIG. 10 includes the manufacturing step explained in FIG. 7. Note that the MISFET 3Q in the element formation region ER is formed by the same manufacturing step as that of the MISFET 1Q.

In this chapter, a case of the MISFETs 1Q and 2Q each to be an n-type MISFET is exemplified. Each p-type MISFET corresponding to this is also formed in the same central region CR. However, explanation for this is omitted.

Figure 10:
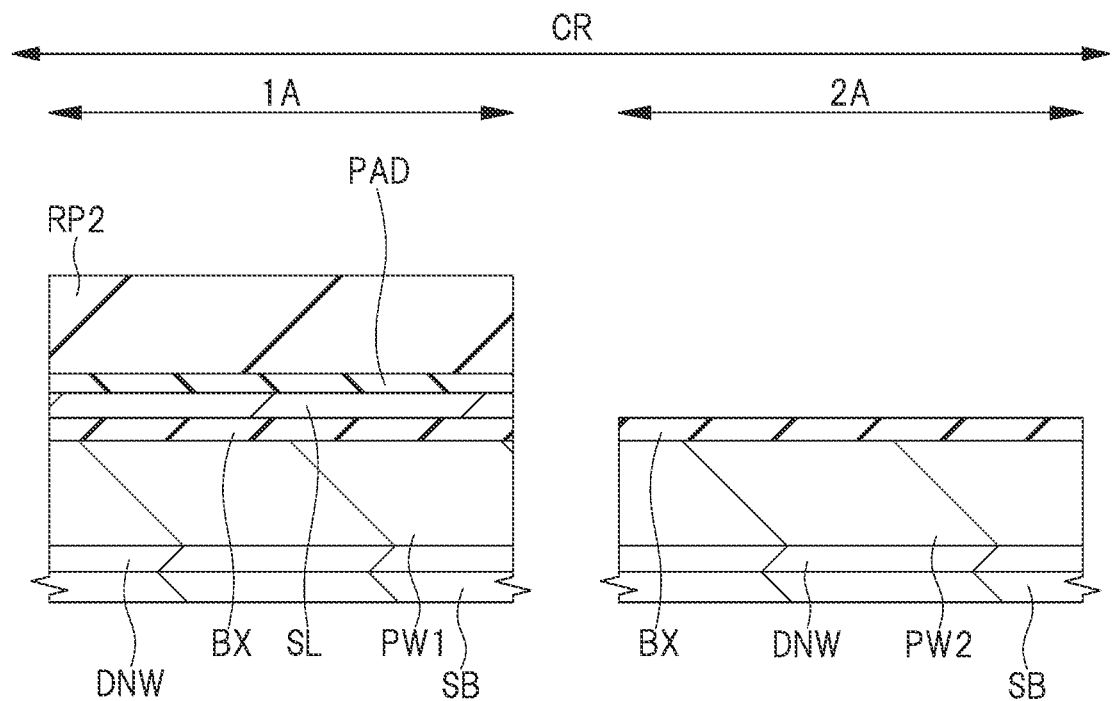
FIG. 10 is a cross-sectional view showing a manufacturing step continued from FIG. 6.

As shown in FIG. 10, first, each well region is formed in the central region CR after the manufacturing step of FIG. 6. By a photolithography method and an ion implantation method, an n-type well region DNW is formed in the semiconductor substrate SB in the central region CR, a p-type well region PW1 is formed in the well region DNW in the SOI region 1A, and a p-type well region PW2 is formed in the well region DNW in the bulk region 2A.

Note that the well region PW1 is a region functioning as a gate of the MISFET 1Q together with a gate electrode G1 described later. A threshold of the MISFET 1Q is controlled by application of a voltage to the well region PW1, the voltage being independent to the gate electrode G1. Alternatively, a region with a p-type impurity of higher concentration than that of the well region PW1 may be formed in a surface of the well region PW1 in contact with the insulating layer BX.

Then, as similar to the manufacturing step explained in FIG. 7, by the formation of the resist pattern RP2 and the wet etching process and the dry etching process making use of the resist pattern RP2 as a mask, the insulating film PAD and the semiconductor layer SL exposed from the resist pattern RP2 in the central region CR are sequentially removed. In this manner, the central region CR is divided into the SOI region 1A where the semiconductor layer SL remains and the bulk region 2A where the semiconductor layer SL is removed. Then, the resist pattern RP2 is removed by an ashing process or others.

Figure 11:
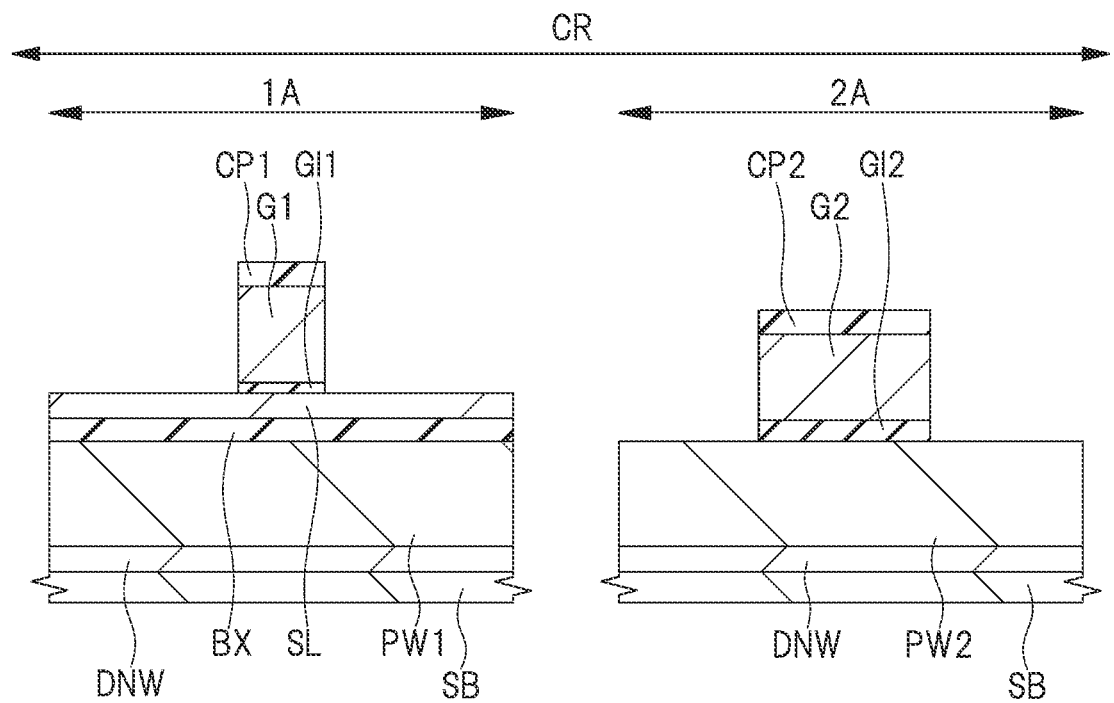
FIG. 11 is a cross-sectional view showing a manufacturing step continued from FIG. 10.

FIG. 11 shows a step of removing the insulating film PAD and the insulating layer BX and a step of forming gate insulating films GI1 and GI2, gate electrodes G1 and G2, and cap films CP1 and CP2.

First, the insulating film PAD in the SOI region 1A and the insulating layer BX in the bulk region 2A are removed by a wet etching process. Next, a thick silicon oxide film is formed on the semiconductor layer SL in the SOI region 1A and the semiconductor substrate SB in the bulk region 2A by a thermal oxidation method. Next, a thick silicon oxide film in the SOI region 1A is selectively removed by a photolithography method and a dry etching method. Next, a thin silicon oxide film is formed on the semiconductor layer SL in the SOI region 1A by another thermal oxidation method. The thin silicon oxide film becomes the gate insulating film GI1 of the MISFET 1Q in the SOI region 1A, and the thick silicon oxide film becomes the gate insulating film GI2 of the MISFET 2Q in the bulk region 2A.

On the gate insulating film GI1 and the gate insulating film GI2, a film made of, for example, a metal oxide film such as hafnium oxide or tantalum oxide and having a higher dielectric constant than that of silicon oxide may be formed by, for example, a CVD method. Then, this metal oxide film may be used as a part of the gate insulating film GI1 and the gate insulating film GI2.

Next, on the gate insulating film GI1 and the gate insulating film GI2, a conductive film such as a polycrystal silicon film is formed by, for example, a CVD method. Next, impurities are selectively doped into the polycrystal silicon film by a photolithography method and an ion implantation method, so that a conductive type of the polycrystal silicon film in the SOI region 1A and the bulk region 2A becomes the n-type. Next, on the polycrystal silicon film, an insulating film such as a silicon nitride film is formed by, for example, a CVD method. Next, a layered film made of the silicon nitride film and the polycrystal silicon film is patterned. In this manner, the gate electrode G1 and the cap film CP1 are formed on the gate insulating film GI1, and the gate electrode G2 and the cap film CP2 are formed on the gate insulating film GI2. Then, the gate insulating film GI1 and the gate insulating film GI2 in other portions than portions below the gate electrode G1 and the gate electrode G2 may be removed.

Figure 12:
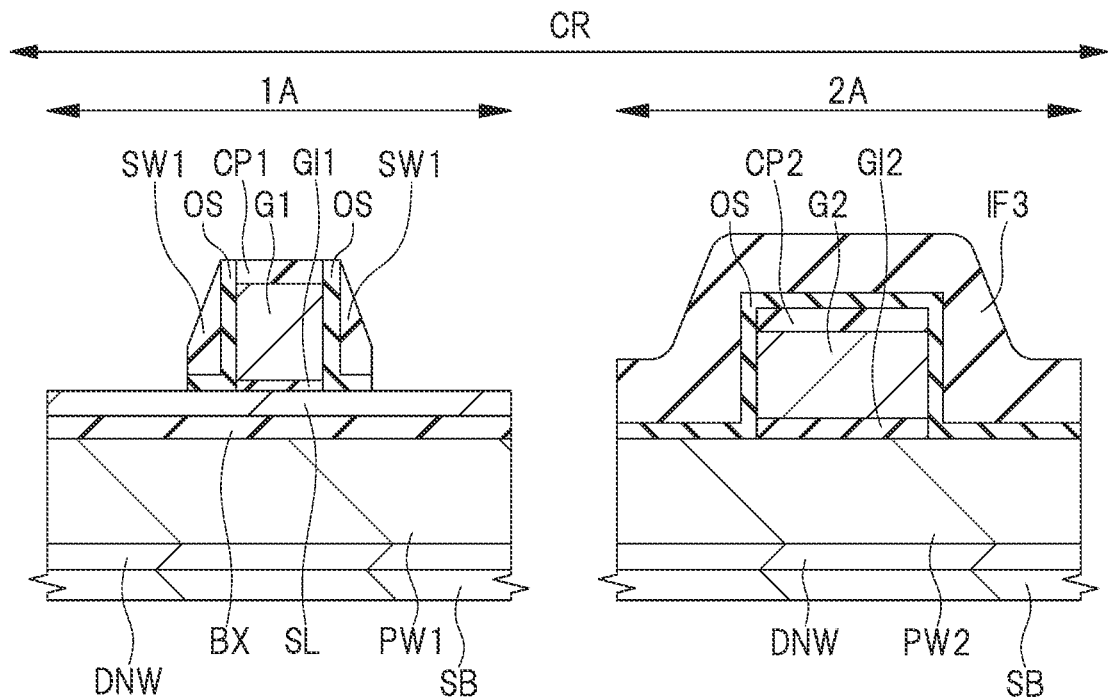
FIG. 12 is a cross-sectional view showing a manufacturing step continued from FIG. 11.

FIG. 12 shows a step of forming an offset spacer OS, an insulating film IF3 and a sidewall spacer SW1.

First, as shown in FIG. 12, on the semiconductor layer SL in the SOI region 1A and the semiconductor substrate SB in the bulk region 2A, the offset spacer OS made of, for example, silicon oxide is formed by, for example, a CVD method so as to cover the gate electrodes G1 and G2 and the cap films CP1 and CP2.

Next, on the offset spacer OS, the insulating film IF3 made of, for example, silicon nitride is formed by, for example, a CVD method. Next, a resist pattern covering the bulk region 2A but opening the SOI region 1A is formed by a photolithography method. Next, the sidewall spacer SW1 is formed in the SOI region 1A by an anisotropic etching process making use of this resist pattern as a mask for the insulating film IF3 in the SOI region 1A. Next, the offset spacer OS exposed from the sidewall spacer SW1 and formed on the semiconductor layer SL and the cap film CP1 is removed by a dry etching process or a wet etching process.

Figure 13:
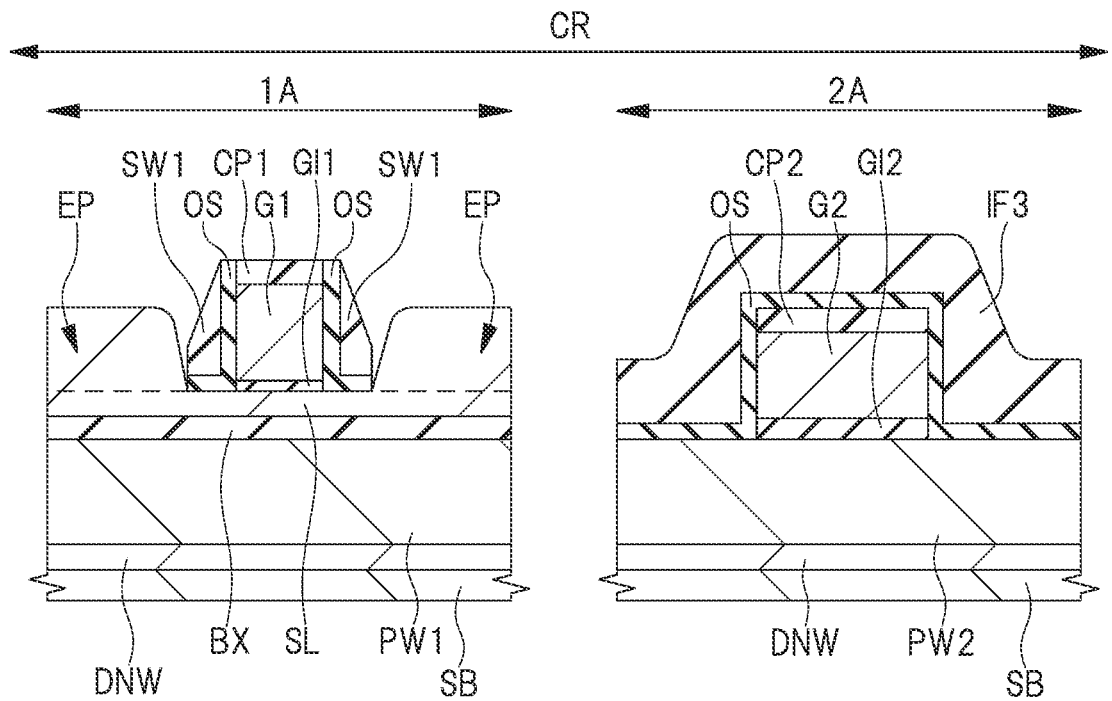
FIG. 13 is a cross-sectional view showing a step of manufacturing a central region of the semiconductor substrate.

FIG. 13 shows a step of forming an epitaxial layer EP.

On the semiconductor layer SL in the SOI region 1A, the epitaxial layer (semiconductor layer) EP made of, for example, single crystal silicon is formed by an epitaxial growth method. At this time, since the gate electrode G1 in the SOI region 1A is covered with the cap film CP1, the epitaxial layer EP is not formed on the gate electrode G1. And, since the bulk region 2A is covered with the insulating film IF3, the epitaxial layer EP is not formed therein.

Note that the epitaxial layer EP and the semiconductor layer SL are made of the same material and are unified. However, in the first embodiment, a boundary between the epitaxial layer EP and the semiconductor layer SL is illustrated with a broken line in order to easily understand the invention.

Figure 14:
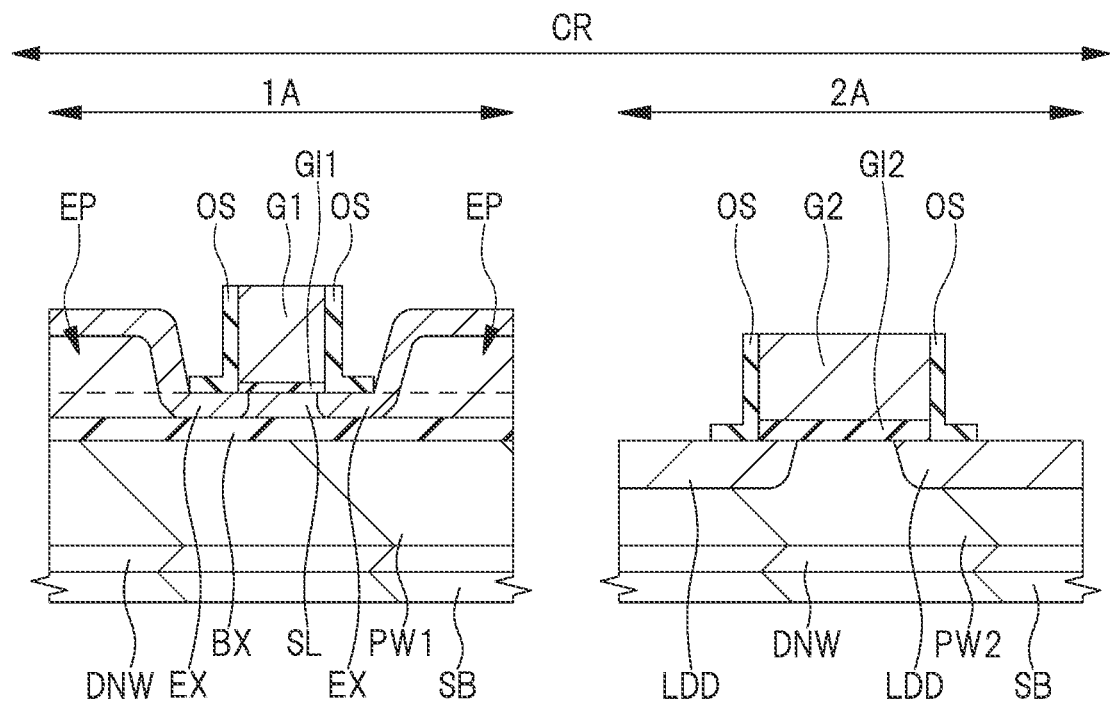
FIG. 14 is a cross-sectional view showing a manufacturing step continued from FIG. 13.

FIG. 14 shows a step of removing the insulating film IF3, the sidewall spacer SW1 and the cap films CP1 and CP2 and a step of forming an impurity region LDD and an extension region EX.

First, a resist pattern covering the SOI region 1A but opening the bulk region 2A is formed. Next, the insulating film IF3 in the bulk region 2A is processed by an anisotropic etching process making use of this resist pattern as a mask. In this manner, the sidewall spacer (SW1) is formed on a side surface of the gate electrode G2. Next, a part of the offset spacer OS in the bulk region 2A is removed by a dry etching process or a wet etching process. Then, this resist pattern is removed by an ashing process.

Next, in the SOI region 1A and the bulk region 2A, the sidewall spacer SW1 and the cap films CP1 and CP2 are removed by an etching process having high selectivity for the offset spacer OS.

Next, by a photolithography method and an ion implantation method, impurities are doped into the semiconductor substrate SB in the bulk region 2A so that the impurity region LDD having the n-type conductivity is formed, and impurities are doped into the semiconductor layer SL and the epitaxial layer EP in the SOI region 1A so that the extension region (impurity region) EX having the n-type conductivity is formed. The extension region EX configures a part of a source region or a drain region of the MISFET 1Q, and the impurity region LDD configures a part of a source region or a drain region of the MISFET 2Q.

Figure 15:
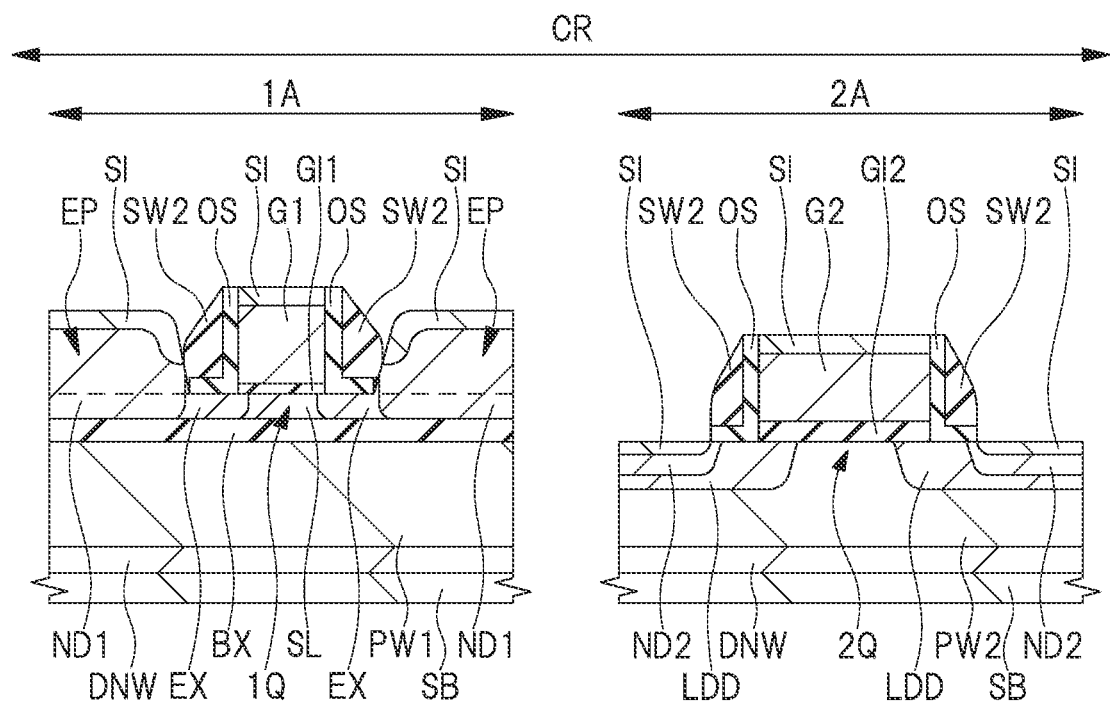
FIG. 15 is a cross-sectional view showing a manufacturing step continued from FIG. 14.

FIG. 15 shows a step of forming a sidewall spacer SW2, diffusion regions ND1 and ND2 and a silicide layer SI.

First, an insulating film made of, for example, silicon nitride is formed so as to cover the gate electrodes G1 and G2 and the insulating film OS. Next, by an anisotropic etching for this insulating film, on a side surface of the gate electrode G1 and a side surface of the gate electrode G2, the sidewall spacer SW2 is formed so that the insulating film OS intervenes.

Next, by a photolithography method and an ion implantation method, impurities are doped into the semiconductor layer SL and the epitaxial layer EP in the SOI region 1A and into the semiconductor substrate SB in the bulk region 2A so that the diffusion region (impurity region) ND1 having the n-type conductivity is formed in the SOI region 1A, and the diffusion region (impurity region) ND2 having the n-type conductivity is formed in the bulk region 2A. The diffusion region ND1 configures a part of a source region or a drain region of the MISFET 1Q, and the diffusion region ND2 configures a part of a source region or a drain region of the MISFET 2Q. Note that an impurity concentration of the diffusion region ND1 is higher than an impurity concentration of the extension region EX, and an impurity concentration of the diffusion region ND2 is higher than an impurity concentration of the impurity region LDD.

Next, on each upper surface of the diffusion regions ND1 and ND2 and the gate electrodes G1 and G2, a silicide layer SIl having a low resistance is formed by a salicide (Self Aligned Silicide) technique.

The silicide layer SI can be specifically formed as follows. First, a metal film intended to form the silicide layer SI is formed so as to cover each upper surface of the diffusion regions ND1 and ND2 and the gate electrodes G1 and G2. This metal film is made of, for example, cobalt, nickel or nickel-platinum alloy. Next, by a thermal process to the semiconductor substrate SB, the metal film is reacted with each material of the diffusion regions ND1 and ND2 and the gate electrodes G1 and G2. In this manner, the silicide layer SI is formed on each upper surface of the diffusion regions ND1 and ND2 and the gate electrodes G1 and G2. The silicide layer SI is made of, for example, cobalt silicide, nickel silicide or nickel-platinum silicide. Then, an unreacted metal film is removed.

In this manner, the MISFET 1Q is formed in the SOI region 1A, and the MISFET 2Q is formed in the bulk region 2A. And, the MISFET 3Q is formed in the element isolating region ER by the same manufacturing steps as those of the MISFET 1Q.

Then, above the MISFETs 1Q to 3Q, an interlayer insulating film, a plug, a wiring and others are formed. Then, a back surface of the semiconductor substrate SB is polished, and the semiconductor substrate SB is thinned, and then, the semiconductor substrate SB is diced into a plurality of semiconductor chips CHP1 and CHP2 by a dicing step as shown in FIG. 1. The explanation for the method of manufacturing the semiconductor device of the first embodiment ends here.

In the foregoing, the invention made by the inventors of the present application has been concretely described on the basis of the embodiments. However, the present invention is not limited to the foregoing embodiments, and various modifications can be made within the scope of the present invention.

What is claimed is:

1. A method of manufacturing a semiconductor device the method comprising the steps of:
   (a) preparing a wafer having:
      a semiconductor substrate including:
         a peripheral region with a first width from an outer edge of the semiconductor substrate toward a center of the semiconductor substrate; and
         a central region surrounded by the peripheral region in a plan view;
      an insulating layer formed on the semiconductor substrate in each of the peripheral region and the central region; and
      a semiconductor layer formed on the insulating layer in each of the peripheral region and the central region;
   (b) after the step (a), forming a first insulating film on the semiconductor layer in each of the peripheral region and the central region;
   (c) after the step (b), forming a first resist pattern selectively covering each of a part of the first insulating film in the peripheral region and a part of the first insulating film in the central region;
   (d) after the step (c), forming a plurality of trenches penetrating through the first insulating film, the semiconductor layer and the insulating layer and reaching an inside of the semiconductor substrate by performing a first etching process with the first resist pattern as a mask, the first resist pattern having an end portion that is the closest to the outer edge of the semiconductor substrate;
   (e) after the step (d), removing the first resist pattern;
   (f) after the step (e), forming a plurality of element isolating portions by filling an inside of each of the plurality of trenches, in each of the peripheral region and the central region, with a second insulating film made of a different material from a material of the first insulating film;
   (g) after the step (f), removing the first insulating film in each of the peripheral region and the central region;
   (h) after the step (g), forming a second resist pattern selectively covering the semiconductor layer in the peripheral region and the semiconductor layer in a part of the central region, the second resist pattern having an end portion that is the closest to the outer edge of the semiconductor substrate; and
   (i) after the step (h), removing the semiconductor layer exposed from the second resist pattern in the central region by performing a second etching process with the second resist pattern as a mask,
   wherein, in the step (h), the second resist pattern is formed such that the end portion of the second resist pattern is positioned to be closer to the outer edge of the semiconductor substrate than a position of the end portion of the first resist pattern in the step (c).

2. The method according to claim 1, wherein, after the step (i), the semiconductor layer remaining in the peripheral region and the semiconductor layer remaining in the central region are surrounded by the element isolating portion in a plan view.

3. The method according to claim 1, wherein, in the step (c), a part of the plurality of trenches is formed so as to extend from the end portion of the first resist pattern to the outer edge of the semiconductor substrate.

4. The method according to claim 1, further comprising the steps of:
(j) after the step (i), removing the insulating layer in a second region where the semiconductor layer in the central region has been removed;
(k) after the step (j), forming a first MISFET in a first region where the insulating layer in the central region and the semiconductor layer in the central region have remained; and
(l) after the step (j), forming a second MISFET in the second region,
wherein the first MISFET and the second MISFET configure a part of an integrated circuit of the semiconductor device.

5. The method according to claim 4, further comprising the step of:

(m) after the step j), forming a third MISFET in a third region where the insulating layer in the peripheral region and the semiconductor layer in the peripheral region have remained,
wherein the third MISFET is a dummy MISFET not configuring the integrated circuit.

6. The method according to claim 1, wherein the step (f) includes:
(f1) forming the second insulating film at the inside of each of the plurality of trenches, and forming the second insulating film on the first insulating film, in each of the central region and the peripheral region, that is outside the plurality of trenches; and
(f2) after the step (f1), removing the second insulating film formed on the first insulating film such that the second insulating film inside of each of the plurality of trenches remains, by a polishing process using a CMP (Chemical Mechanical Polishing) method.

7. The method according to claim 1,
wherein the first insulating film is a silicon nitride film, and
wherein the second insulating film is a silicon oxide film.

* * * * *